United States Patent
Yin et al.

(10) Patent No.: US 9,413,390 B1
(45) Date of Patent: Aug. 9, 2016

(54) HIGH THROUGHPUT LOW-DENSITY PARITY-CHECK (LDPC) DECODER VIA RESCHEDULING

(71) Applicant: Xilinx, Inc., San Jose, CA (US)

(72) Inventors: Bei Yin, Houston, TX (US); Michael Wu, Palo Alto, CA (US); Christopher H. Dick, San Jose, CA (US); Joseph R. Cavallaro, Pearland, TX (US)

(73) Assignee: XILINX, INC., San Jose, CA (US)

( * ) Notice: Subject to any disclaimer, the term of this patent is extended or adjusted under 35 U.S.C. 154(b) by 118 days.

(21) Appl. No.: 14/333,436

(22) Filed: Jul. 16, 2014

(51) Int. Cl.
*H03M 13/11* (2006.01)

(52) U.S. Cl.
CPC ........ *H03M 13/1105* (2013.01); *H03M 13/114* (2013.01); *H03M 13/1177* (2013.01); *H03M 13/116* (2013.01); *H03M 13/1111* (2013.01); *H03M 13/1114* (2013.01); *H03M 13/1137* (2013.01); *H03M 13/1165* (2013.01)

(58) Field of Classification Search
CPC ............ H03M 13/114; H03M 13/116; H03M 13/1137; H03M 13/1111; H03M 13/1114; H03M 13/1165; H03M 13/1177
USPC ........................................................ 714/752
See application file for complete search history.

(56) References Cited

U.S. PATENT DOCUMENTS

| | | | | |
|---|---|---|---|---|
| 6,606,718 | B1 * | 8/2003 | Bessios | H03M 13/2721 714/701 |
| 7,000,174 | B2 * | 2/2006 | Mantha | H03M 13/1102 714/748 |
| 8,438,459 | B2 * | 5/2013 | Cho | H03M 13/1114 714/758 |
| 8,489,957 | B2 * | 7/2013 | Wesel | H03M 13/1111 714/752 |
| 8,572,453 | B2 * | 10/2013 | Maehata | H03M 13/1111 714/752 |
| 8,612,835 | B2 * | 12/2013 | Yokokawa | H03M 13/1137 714/758 |
| 8,650,457 | B1 * | 2/2014 | Yeo | H03M 13/1137 714/755 |
| 8,713,397 | B2 * | 4/2014 | Yang | H03M 13/114 714/752 |
| 8,751,895 | B2 * | 6/2014 | Obata | H03M 13/112 375/262 |
| 8,984,376 | B1 * | 3/2015 | Norrie | H03M 13/1142 714/772 |
| 9,015,568 | B2 * | 4/2015 | Henige | H03M 13/13 714/810 |

\* cited by examiner

*Primary Examiner* — James C Kerveros
(74) *Attorney, Agent, or Firm* — Gerald Chan

(57) ABSTRACT

A LDPC decoder utilizes a new schedule that breaks a dependency between data of different layers of a parity check matrix, so that the forward scan in the next layer can begin to perform after a predetermined time has elapsed (i.e. a delay) since the backwards scan of the previous layer has begun, and before the backwards scan of the previous layer is completed. Accordingly, the computation at the next layer can begin as soon as possible.

20 Claims, 9 Drawing Sheets

HIGH THROUGHPUT LOW-DENSITY PARITY-CHECK (LDPC) DECODER VIA RESCHEDULING

FIELD

The present disclosure relates to low-density parity-check (LDPC) decoders. In particular, it relates to high throughput LDPC decoders via rescheduling.

BACKGROUND

Because of their good error correction performance, LDPC codes are widely used in many communication standards. To decode LDPC codes with low complexity and fast convergence, a minimum-summation (min-sum) layered LDPC decoder may be employed. The min-sum layered decoder updates soft bit information from layer to layer of the parity check matrix. Inside each layer, in order to compute the minimum (MIN) value, a computation core (e.g., of at least one processor) performs a forward scan and a backward scan of the same layer of the parity check matrix. Because of the data dependency between layers, the forward scan of a next layer can only begin after the backward scan of the previous layer finishes. This means that for an N number layer LDPC code, the decoder needs to scan 2N (i.e. 2*N) times in total. This limits the decoding throughput.

SUMMARY

A method for a low-density parity-check (LDPC) decoder includes: performing, using a processing unit, a forward scan in a first direction of layer L1 of a parity check matrix to determine a forward minimum of the layer L1, wherein the parity check matrix comprises N number of layers and M number of columns; performing, using the processing unit, a backwards scan in a second direction of the layer L1 of the parity check matrix to determine a backward minimum of the layer L1, after the forward scan of the layer L1 is completed; updating, using the processing unit, layer L2 of the parity check matrix using a minimum of the forward minimum of the layer L1 and the backward minimum of the layer L1; performing, using the processing unit, a forward scan in the second direction of the layer L2 of the parity check matrix to determine a forward minimum of the layer L2, wherein the act of performing the forward scan in the second direction of the layer L2 of the parity check matrix begins (1) after a predetermined time has elapsed since the backwards scan of the layer L1 has begun and (2) before the backwards scan of the layer L1 is completed; and performing, using the processing unit, a backwards scan in the first direction of the layer L2 of the parity check matrix to determine a backward minimum of the layer L2, after the forward scan of the layer L2 is completed.

A low-density parity-check (LDPC) decoder includes a processing unit configured to: perform a forward scan in a first direction of layer L1 of a parity check matrix to determine a forward minimum of the layer L1, wherein the parity check matrix comprises N number of layers and M number of columns; perform a backwards scan in a second direction of the layer L1 of the parity check matrix to determine a backward minimum of the layer L1, after the forward scan of the layer L1 is completed; update layer L2 of the parity check matrix using a minimum of the forward minimum of the layer L1 and the backward minimum of the layer L1; perform a forward scan in the second direction of the layer L2 of the parity check matrix to determine a forward minimum of the layer L2, wherein the processing unit is configured to begin performing the forward scan in the second direction of the layer L2 of the parity check matrix (1) after a predetermined time has elapsed since the backwards scan of the layer L1 has begun and (2) before the backwards scan of the layer L1 is completed; and perform a backwards scan in the first direction of the layer L2 of the parity check matrix to determine a backward minimum of the layer L2, after the forward scan of the layer L2 is completed.

Other aspects and features will be evident from reading the following detailed description and accompanying drawings.

DETAIL DESCRIPTION

Figure 1:
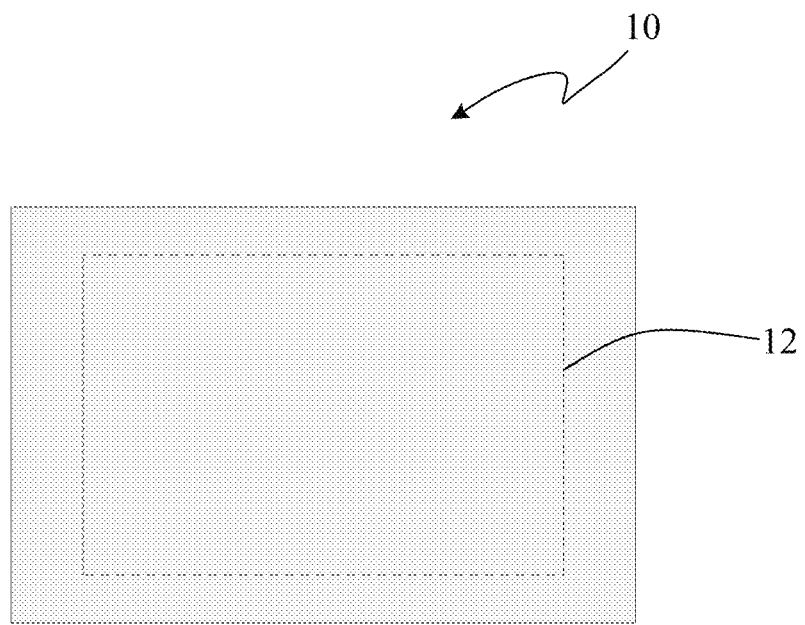
FIG. 1 illustrates a LDPC decoder.

Various embodiments are described hereinafter with reference to the figures, in which exemplary embodiments are shown. The claimed invention may, however, be embodied in different forms and should not be construed as being limited to the embodiments set forth herein. Like reference numerals refer to like elements throughout. Like elements will, thus, not be described in detail with respect to the description of each figure. It should also be noted that the figures are only intended to facilitate the description of the embodiments. They are not intended as an exhaustive description of the claimed invention or as a limitation on the scope of the claimed invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described. The features, functions, and advantages may be achieved independently in various embodiments or may be combined in yet other embodiments.

The methods and apparatus disclosed herein provide a system for high throughput low-density parity-check (LDPC) decoders via rescheduling. The disclosed methods and apparatus can significantly improve a decoding throughput of the LDPC decoder. In particular, a new scheduling scheme is employed to reduce data dependency in a layered LDPC decoder. The new schedule algorithm dramatically increases the decoding throughput. This is especially helpful for high data rate transmission systems, where the decoder runs at a low clock frequency, such as for the DOCSIS3.1 standard.

As previously mentioned above, because of their good error correction performance, LDPC codes are widely used in many communication standards. To decode LDPC codes with low complexity and fast convergence, a minimum-summation (min-sum) layered LDPC decoder may be employed. The min-sum layered decoder updates soft bit information from layer to layer of the parity check matrix. Inside each layer, in order to compute the minimum (MIN) value, a computation core (e.g., of at least one processor) performs a forward scan and a backward scan of the same layer of the parity check matrix. Because of the data dependency between layers, the forward scan of the next layer can only begin after the backward scan of the previous layer finishes. This means that for an N number layer LDPC code, the decoder needs to scan 2N (i.e. 2*N) times in total. This limits the decoding throughput.

In order to increase the decoding throughput, a new schedule is employed that breaks the dependency between the data of different layers of the parity check matrix, so that the forward scan in the next layer can begin to perform after a predetermined time has elapsed (i.e. a delay) since the backwards scan of the previous layer has begun, and before the backwards scan of the previous layer is completed. The idea is to reschedule the two-step minimum (MIN) calculation in the LDPC decoder, such that the computation at the next layer can begin as soon as possible. The new schedule also avoids the data conflict in the layered LDPC decoder.

FIG. 1 illustrates a LDPC decoder 10. The LDPC decoder 10 includes a processing unit 12 configured to perform decoding. The processing unit 12 may include an integrated circuit. For example, the processing unit 12 of the decoder 10 may include one or more processor(s). The processing unit 12 may also include software. In some embodiments, the processing unit 12 may be configured to implement a trellis structure for LDPC codes. An example of a trellis structure for LDPC codes will be described below with reference to FIG. 2. Also, in some embodiments, the processing unit 12 may be configured to implement a parity check matrix for performing decoding. An example of a parity check matrix will be described below with reference to FIG. 3. In addition, in some embodiments, the processing unit 12 may include memory blocks for storing bits and information involved in a decoding process. Furthermore, in some embodiments, the processing unit 12 of the decoder 10 may include memory to store parity check matrix, memory address generator, barrel shifter to access memory data, memory to store soft information, computation module for forward and backward scan, or any combination of the foregoing.

Figure 2:
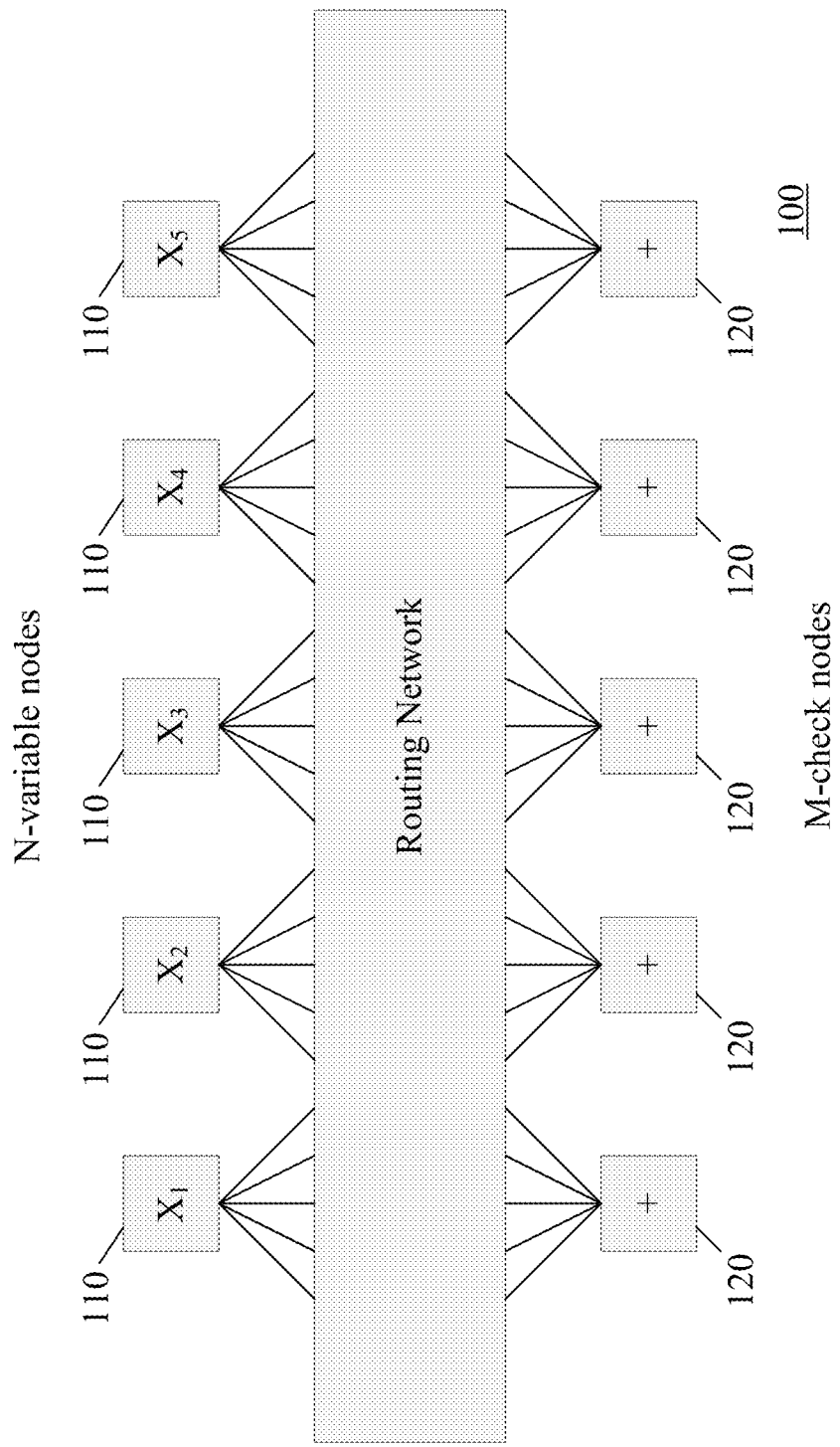
FIG. 2 is a schematic diagram depicting a trellis structure for low-density parity-check (LDPC) codes.

FIG. 2 is a schematic diagram 100 depicting a trellis structure for LDPC codes. An M×N LDPC code may be viewed as M parallel concatenated single parity check (PCSPC) codes. In this figure, N number of variable nodes ($x_1$, $x_2$, $x_3$, $x_4$, and $x_5$) 110 are connected to M number of check nodes (+) 120 via a routing network 130. Although five nodes 110 are shown, in other embodiments, there may be fewer than five nodes 110 (e.g., four nodes, three nodes, two nodes, etc.), or more than five nodes 110. Also, although only five check nodes 120 are shown, in other embodiments, there may be fewer than five check nodes 120 (e.g., four check nodes, three check nodes, two check nodes, etc.), or more than five check nodes 120.

Figure 3:
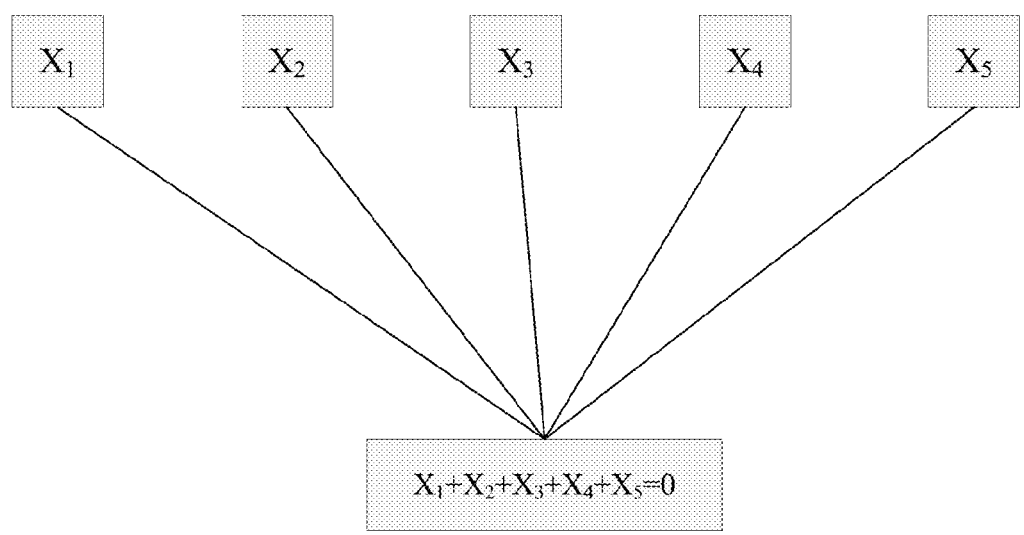
FIG. 3 is a schematic diagram showing details of the trellis structure of FIG. 2.

FIG. 3 is a schematic diagram showing details of the trellis structure for one of the check nodes 120 of FIG. 2. This figure illustrates a trellis representation for LDPC codes, where a single parity check (SPC) code is considered as a low-weight two-state trellis, starting at state zero (0) and ending at state zero (0). In this example, five nodes ($x_1$ to $x_5$) and their relationship with respect to a check node are shown. However, in other embodiments, there may be more than five nodes, or fewer than five nodes.

Figures 4A, 4B:
FIGS. 4A and 4B are parts of a diagram illustrating an exemplary parity check matrix that may be employed in a LDPC decoder.

FIGS. 4A and 4B are parts of a diagram illustrating an exemplary parity check matrix 300 that may be employed by (e.g., implemented in) the processing unit 12 of the LDPC decoder 10. In some embodiments, the LDPC decoder 10 is configured for a quasi-cyclic LDPC code. For example, the parity check matrix 300 for rate 0.89 LDPC in DOCSIS3.1 standard may be employed, and is defined as shown in FIGS. 4A and 4B.

In this figure, the parity check matrix 300 includes N number of layers and M number of columns. The parity check matrix 300 comprises a number of cells. Each cell in the parity check matrix 300 represents a sub-matrix, which may be an identity matrix, a cyclically-shifted identity matrix, or an all-zero matrix. A sub-matrix containing a number represents a shift value for an identity matrix. For example, the number 93 in a sub-matrix of the parity check matrix 300 indicates an identity matrix that is cyclically shifted to the right by 93. Note that a sub-matrix containing a hyphen (-) represents an all-zero matrix.

In the minimum-summation (min-sum) layered decoding algorithm, each row of the parity check matrix 300 is one layer. Inside each layer, the min-sum layered decoding algorithm decodes the LDPC code by computing the minimum (MIN) at each check node, and the summation (SUM) at each variable node. The check node computation is the main decoding complexity. The MIN computation at the check node may be decomposed into two items: (1) a forward scan, and (2) a backward scan. The forward scan $\alpha$ is computed as:

$$\alpha(l+1) = \mathrm{MIN}(\alpha(l), \gamma(l)),$$

where $\gamma(l)$ is the branch metric, and is equal to the sum of the channel log likelihood ratio (LLR) and the a priori information for bit $x_i$. After $\alpha$ is computed, the backward scan $\beta$ may be computed as:

$$\beta(l-1) = \mathrm{MIN}(\beta(l), \gamma(l)).$$

In some embodiments, $\alpha$ may initialized as a large number, and then the minimum may be determined. Similarly, in some embodiments, $\beta$ may be initialized as a large number, and then the minimum may be determined. Also, the extrinsic information for bit $x_i$ may be computed as:

$$\mathrm{Ext}(l) = \mathrm{MIN}(\alpha(l), \beta(l)).$$

Then, E(l) is used for updating $\gamma(l)$ which will be used in the next forward scan.

In some embodiments, a forward scan may be performed with an increase in the index i, which represents the bit location, and a backwards scan may be performed with a decrease in the index i. In other embodiments, a forward scan may be performed with a decrease in the index i, and a backwards scan may be performed with an increase in the index i. Also, in some embodiments, a forward scan (e.g., $\alpha$) may be a first pass of a scan, and a backwards scan (e.g., $\beta$) may be a second pass of the scan in the opposite direction of the first scan.

Figure 5:
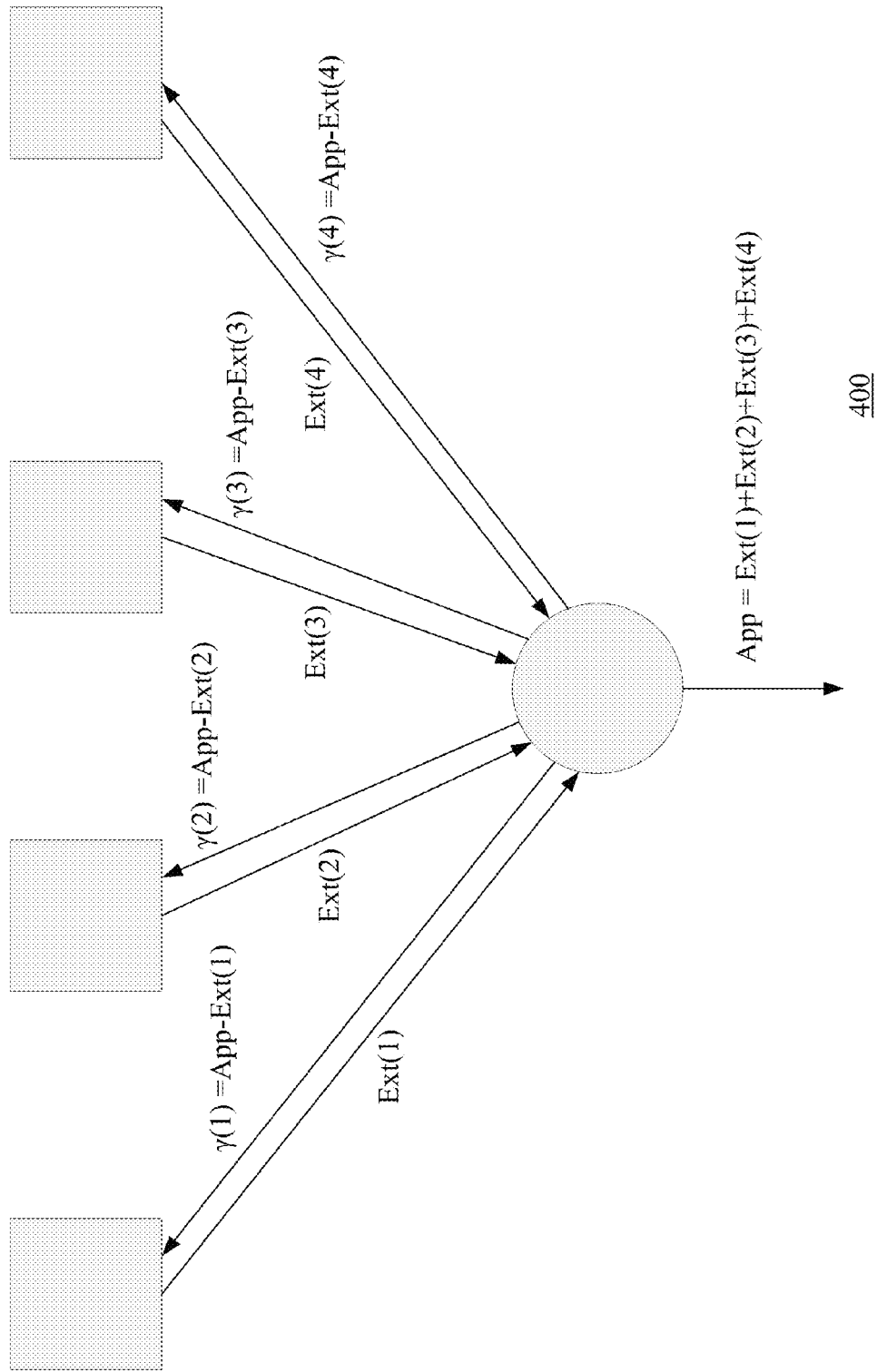
FIG. 5 is a schematic diagram depicting how a branch metric $\gamma(i)$ for a LDPC decoder is determined.

FIG. 5 is a schematic diagram 400 depicting how the branch metric $\gamma(i)$ for the LDPC decoder 10 is determined, in accordance with at least one embodiment of the present disclosure. In the figure, "App" is a LLR value (soft information to represent the probability to be 0/1 at a bit) stored in the LLR memory. In some embodiments, the LLR values may be obtained from detection modules for input to the LDPC decoder 10. The LDPC decoder updates these LLR values at each layer, and after a number of iterations, outputs decoded information bit.

When there is a new LDPC code to decode, the decoder 10 (e.g., the processing unit 12 in the decoder 10) first initializes the and the to a large number (e.g., positive infinity (+∞)). Then, the MIN and SUM computations are performed by the processing unit 12 from layer to layer of the parity check matrix 300. After finishing the computation of the last layer of the parity check matrix 300, the decoder 10 finishes one iteration of the decoding. The processing unit 12 of the decoder 10 can then start the next iteration of decoding from the first layer again. After several numbers of iterations (e.g., a predetermined number of iterations to be performed), the decoder 10 outputs the decoded bits. The procedure for two layers of computation and the scheduling for the LDPC decoder 10 are illustrated in FIG. 6.

Figure 6:
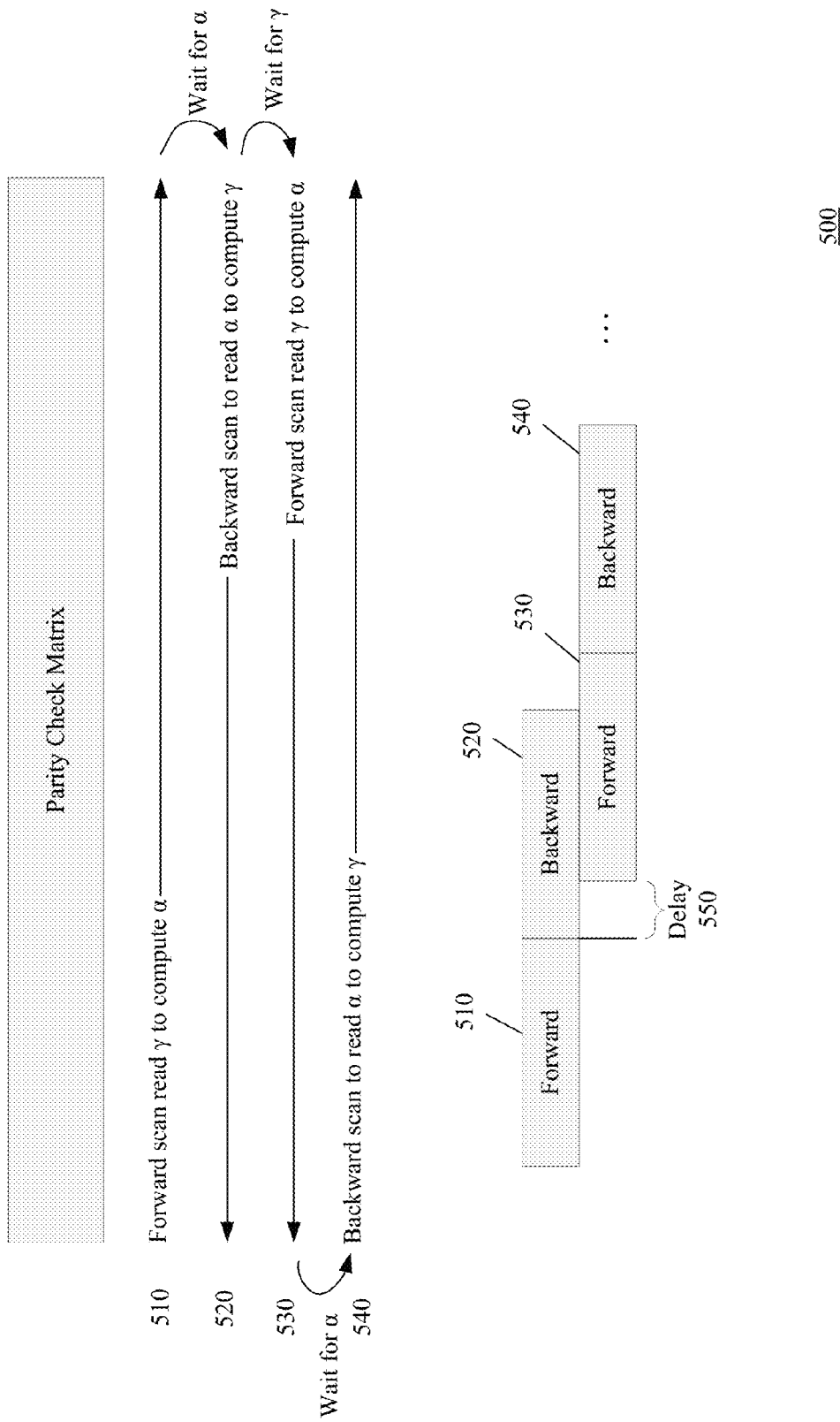
FIG. 6 is a schematic diagram illustrating a scheduling for a LDPC decoder.

In particular, FIG. 6 is a schematic diagram 500 illustrating the scheduling for the LDPC decoder 10 in accordance with at least one embodiment of the present disclosure. In order to increase the throughput of the LDPC decoder 10, the decoder 10 employs a new scheduling scheme that pipelines the forward scan and backward scan. This scheduling scheme reverses the direction of the forward scan in the next layer. For example, if the forward scan in the previous layer scans from left to right, then the forward scan in the next layer scans from right to left. This procedure for two layers is shown in FIG. 6. In particular, a forward scan α 510 of the first layer of the parity check matrix to determine a forward minimum of the first layer is performed from left to right. After the forward scan α 510 of the first layer is complete, a backward scan β 520 of the first layer to determine a backward minimum of the first layer is performed from right to left. Then, the second layer of the parity check matrix is updated with the extrinsic information Ext(l), which is equal to the minimum of the forward minimum of the first layer and the backward minimum of the first layer (i.e. Ext(l)=MIN(α(l),β(l))).

After a predetermined time (i.e. a delay 550) has elapsed since the backward scan β 520 of the first layer has begun, and before the backward scan of the first layer is completed, a forward scan α 530 of the second layer of the parity check matrix to determine a forward minimum of the second layer may begin, wherein the scanning direction is from right to left. After the forward scan α 530 of the second layer is complete, a backward scan β 540 of the second layer to determine a backward minimum of the second layer is performed from left to right. Then, the third layer of the parity check matrix is updated with the extrinsic information Ext(l), which is equal to the minimum of the forward minimum of the second layer and the backward minimum of the second layer (i.e. Ext(l)=MIN(α(l),β(l))). The procedure is then repeated for the subsequent layers of the parity check matrix for a predetermined number of iterations.

In some embodiments, by defining the total number of layers as:

k=number of layers×number of iterations, the corresponding forward and backward scans may be computed as follow:
1. For k=odd numbers:
 a. The forward scan may be computed as α(l+1)=MIN(α(l),γ(l))
 b. The backward scan may be computed as β(l−1)=MIN(β(l),γ(l)).
 Also, Ext(l)=MIN(α(l),β(l)),
2. For k=even numbers:
 a. The forward scan may be computed as α(l−1)=MIN(α(l),γ(l))
 b. The backward scan may be computed as β(l+1)=MIN(β(l),γ(l)).
 Also, Ext(l)=MIN(α(l),β(l)).

The above scheduling scheme partially breaks up the data dependency between the backward scan in the previous layer and the forward scan in the next layer. The forward scan begins after the backward scan begins with a fixed delay 550. The delay 550 is implemented to avoid the conflict between writing γ(l) in the previous layer and reading γ(l) in the next layer.

It should be noted that the predetermined time (i.e. the delay 550) to be employed may be determined by analyzing computer simulation data of the LDPC decoder 10 using different delays. The simulation data of the decoder 10 may then be evaluated to determine what delay 550 is sufficient to provide decoding without incurring a conflict.

In addition, it should be noted that the predetermined number of iterations to be performed by the LDPC decoder 10 may be determined by analyzing computer simulation data of the LDPC decoder 10 running for a different number of iterations. Such simulation data of the decoder 10 may be evaluated to determine the number of iterations that are sufficient to provide decoding without incurring a conflict.

Figure 7:
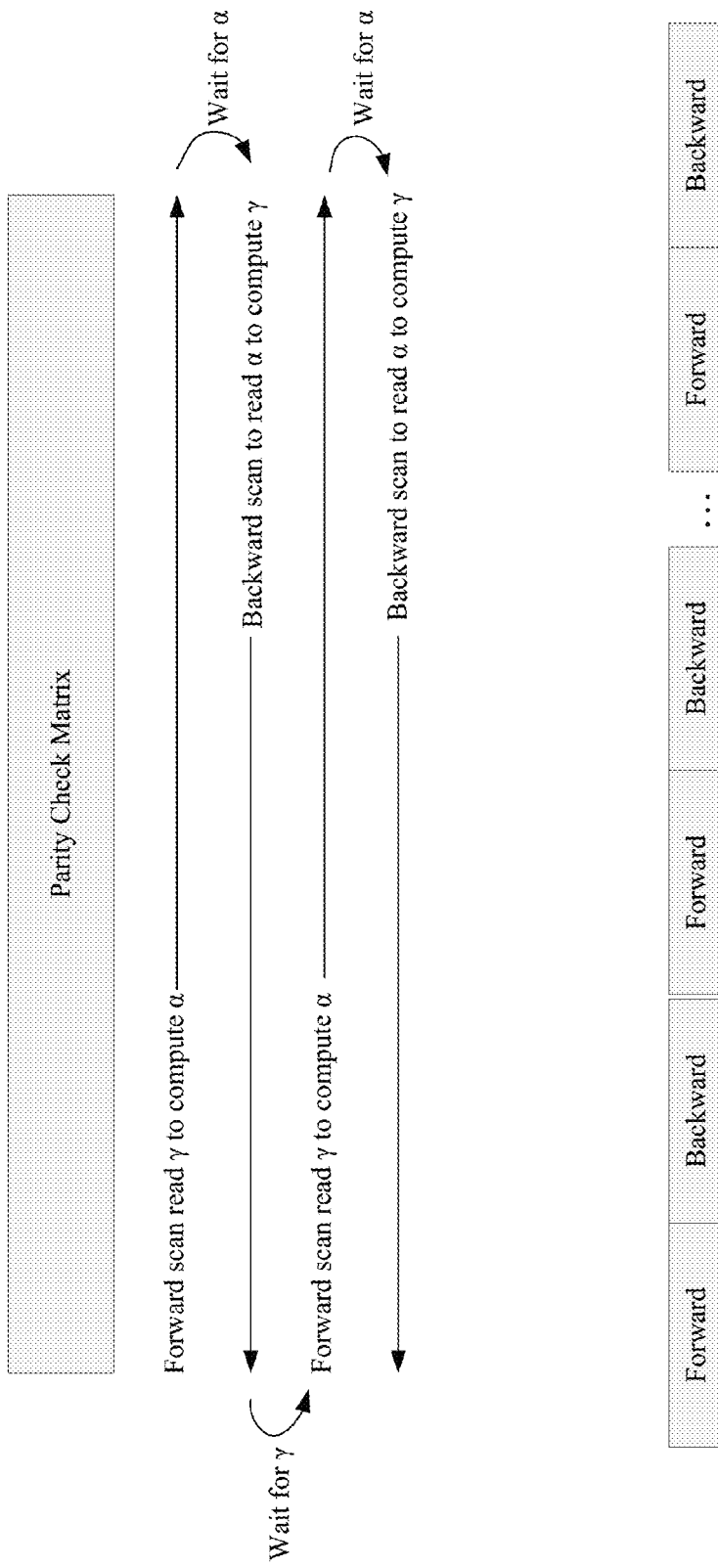
FIG. 7 is a schematic diagram illustrating another scheduling for a LDPC decoder.

As illustrated by the above example, the scheduling may improve the LDPC decoder 10 throughput by almost twice. By introducing a small delay 550, the LDPC decoder 10 is conflict free. Also, the above scheduling for the LDPC decoder 10 is advantageous compared to another scheduling scheme shown in FIG. 7. As shown in FIG. 7, the data dependency forces the backward scan to wait until all a in the forward scan are updated. The data dependency also forces the forward scan in the next layer to wait for all γ updated by backward scan in the previous layer. Thus, this data dependency limits the LDPC decoder throughput. As shown in the scheduling, even if the decoder has enough resource to compute the forward scan and backward scan in the same time, the decoding cannot be pipelined.

Figure 8:
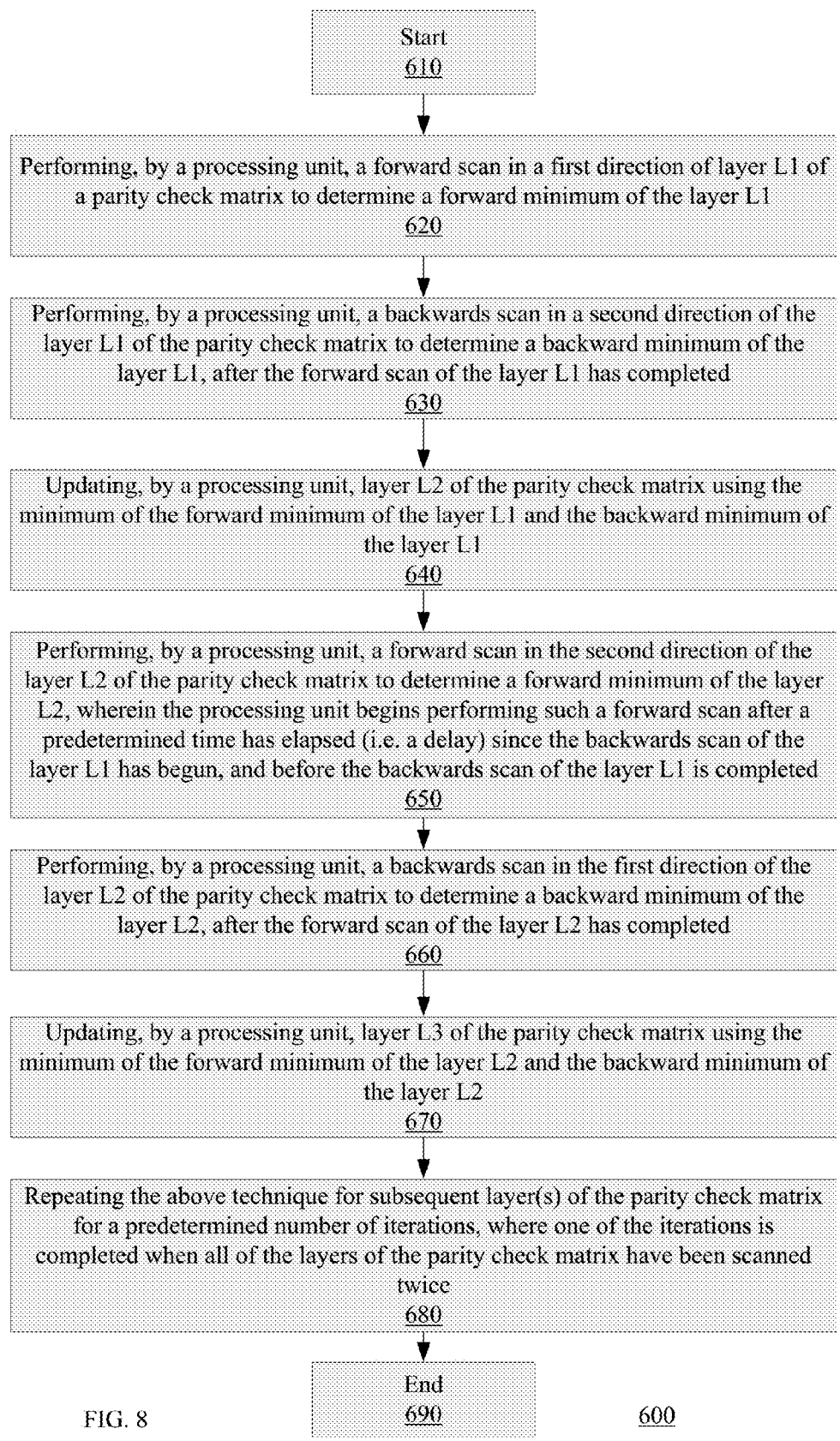
FIG. 8 is a flow diagram showing a method for a LDPC decoder.

FIG. 8 is a flow diagram showing a method 600 for a LDPC decoder (e.g., the LDPC decoder 10), in accordance with at least one embodiment of the present disclosure. At the item 610 of the method 600, the processing unit 12 of the LDPC decoder 10 performs a forward scan in a first direction (e.g., from left to right) of layer L1 of a parity check matrix to determine a forward minimum of the layer L1 (item 620). In one or more embodiments, the parity check matrix comprises N number of layers and M number of columns, where the number of layers is equal to an integer that is less than or equal to N (e.g., any value from 1 to N). In some embodiments, the layer L1 may be the first one of the layers in the order. In other embodiments, the layer L1 may be any of other layers, which may or may not be the first one of the layers in the order.

Then, after the forward scan of the layer L1 has completed, the processing unit 12 of the LDPC decoder 10 performs a backward scan in a second direction (e.g., from right to left) of the layer L1 of the parity check matrix to determine a backward minimum of the layer L1 (item 630).

Then, the processing unit 12 updates a next layer L2 of the parity check matrix using the minimum of the forward minimum of the layer L1 and the backward minimum of the layer L1 (item 640).

Next, the processing unit 12 performs a forward scan in the second direction (e.g., from right to left) of the layer L2 of the parity check matrix to determine a forward minimum of the layer L2, wherein the processing unit 12 begins performing such a forward scan after a predetermined time has elapsed (i.e. a delay) since the backwards scan of the layer L1 has begun, and before the backwards scan of the layer L1 is completed (item 650).

After the forward scan of the layer L2 has completed, the processing unit 12 performs a backwards scan in the first direction (e.g., from left to right) of the layer L2 of the parity check matrix to determine a backward minimum of the layer L2 (item 660).

Then, the processing unit 12 updates a next layer L3 of the parity check matrix using the minimum of the forward minimum of the layer L2 and the backward minimum of the layer L2 (item 670).

Then, the above technique may be repeated for subsequent layers (e.g., for layer L4, layer L5, etc.) of the parity check matrix for a predetermined number of iterations, where one of the iterations is completed when all of the layers of the parity check matrix have been scanned twice (item 680). After the parity check matrix has been scanned for the predetermined number of iterations, the method 600 ends at item 690. In some embodiments, the parity check matrix may have only two layers. In such cases, the method 600 may not include items 670 and 680. In other embodiments, the parity check matrix may have more than two layers.

Also, in some embodiments, the number of iteration(s) may be one. In such cases, the one iteration may be considered performed when all of the layers of the parity check matrix have been scanned twice the first time. In other embodiments, the number of iteration(s) may be more than one.

In addition, the above exemplary embodiments illustrate that a first direction of scanning (e.g., forward scan) and a second direction of scanning (e.g., backward scan) performed by the processing unit 12 of the decoder 10 are in opposite directions. In one or more embodiments, the first direction (e.g., forward scan direction) may be from left to right, or from right to left. Also, in one or more embodiments, the second direction (e.g., backward scan direction) may be from right to left, or from left to right.

Furthermore, where methods described above indicate certain events occurring in certain order, those of ordinary skill in the art having the benefit of this disclosure would recognize that the ordering may be modified and that such modifications are in accordance with the variations of the claimed invention. Additionally, parts of methods may be performed concurrently in a parallel process when possible, as well as performed sequentially. In addition, more parts or less part of the methods may be performed.

As discussed above, in one or more embodiments, the processing unit 12 is employed to scan the layers of the parity check matrix. In some embodiments, the processing unit 12 may include sub-processing units, and the layers are scanned by their respective sub-processing units. A sub-processing unit may be an integrated circuit, such as a processor, or a portion thereof. Also, in some embodiments, a sub-processing unit may at least partially be implemented using software.

In addition, in some embodiments, an integrated circuit (IC) may implement/embody the decoder 10. For example, in some embodiments, an IC may implement/embody the processing unit 12 of the decoder 10.

Figure 9:
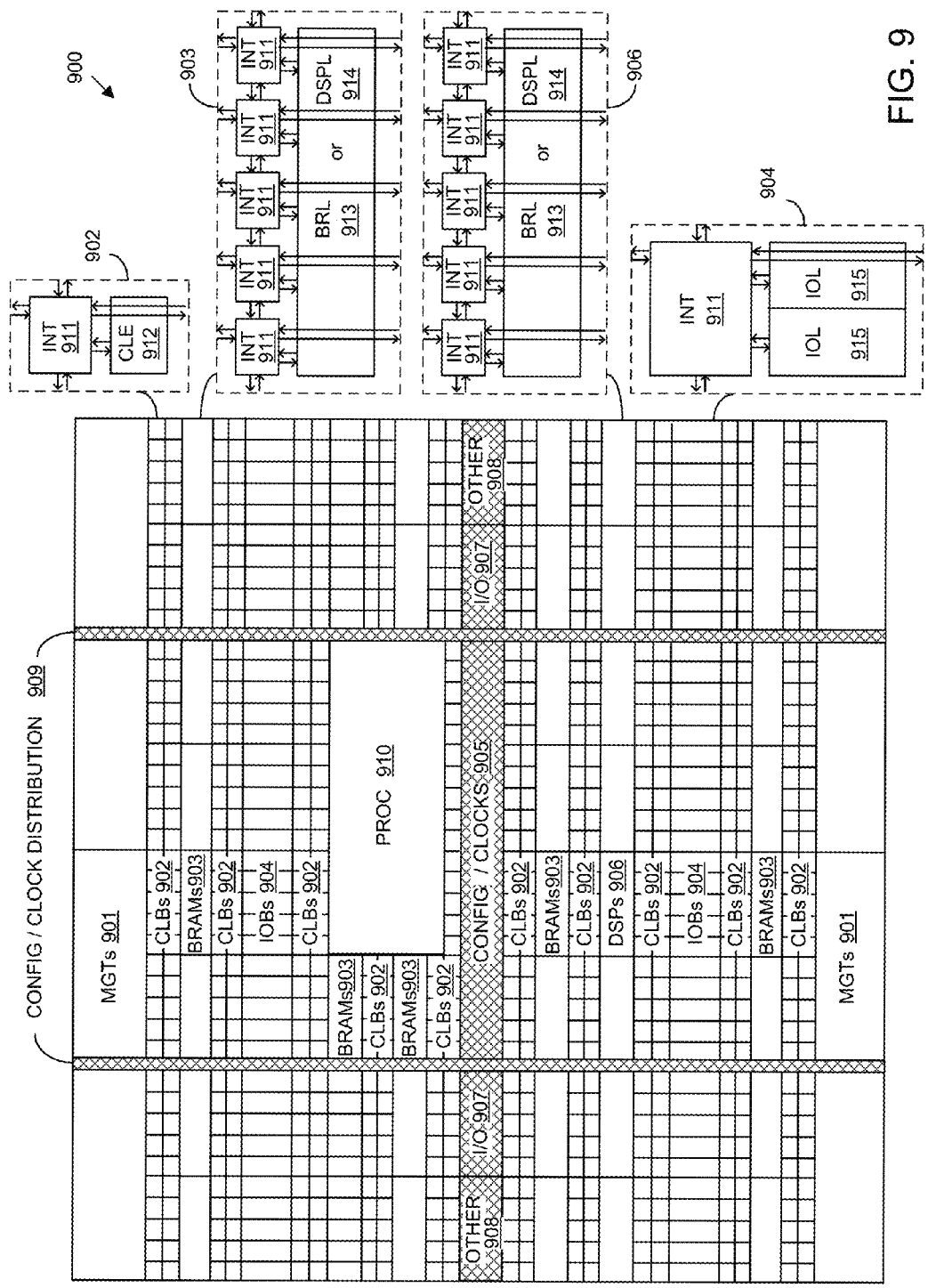
FIG. 9 is a block diagram illustrating an exemplary architecture for an IC.

FIG. 9 is a block diagram illustrating an exemplary architecture 900 for an IC, which may implement/embody the decoder 10. For example, the IC may be employed to scan layers of a parity check matrix in some embodiments. In one aspect, architecture 900 is implemented within a field programmable gate array (FPGA) type of IC. As shown, architecture 900 includes several different types of programmable circuit, e.g., logic, blocks. For example, architecture 900 can include a large number of different programmable tiles including multi-gigabit transceivers (MGTs) 901, configurable logic blocks (CLBs) 902, random access memory blocks (BRAMs) 903, input/output blocks (IOBs) 904, configuration and clocking logic (CONFIG/CLOCKS) 905, digital signal processing blocks (DSPs) 906, specialized I/O blocks 907 (e.g., configuration ports and clock ports), and other programmable logic 908 such as digital clock managers, analog-to-digital converters, system monitoring logic, and so forth.

In some ICs, each programmable tile includes a programmable interconnect element (INT) 911 having standardized connections to and from a corresponding INT 911 in each adjacent tile. Therefore, INTs 911, taken together, implement the programmable interconnect structure for the illustrated IC. Each INT 911 also includes the connections to and from the programmable logic element within the same tile, as shown by the examples included at the top of FIG. 9.

For example, a CLB 902 can include a configurable logic element (CLE) 912 that can be programmed to implement user logic plus a single INT 911. A BRAM 903 can include a BRAM logic element (BRL) 913 in addition to one or more INTs 911. Typically, the number of INTs 911 included in a tile depends on the height of the tile. As pictured, a BRAM tile has the same height as five CLBs, but other numbers (e.g., four) also can be used. A DSP tile 906 can include a DSP logic element (DSPL) 914 in addition to an appropriate number of INTs 911. An IOB 904 can include, for example, two instances of an I/O logic element (IOL) 915 in addition to one instance of an INT 911. As will be clear to those of skill in the art, the actual I/O pads connected, for example, to IOL 915 typically are not confined to the area of IOL 915.

In the example pictured in FIG. 9, a columnar area near the center of the die, e.g., formed of regions 905, 907, and 908, can be used for configuration, clock, and other control logic. Horizontal areas 909 extending from this column are used to distribute the clocks and configuration signals across the breadth of the programmable IC.

Some ICs utilizing the architecture illustrated in FIG. 9 include additional logic blocks that disrupt the regular columnar structure making up a large part of the IC. The additional logic blocks can be programmable blocks and/or dedicated circuitry. For example, a processor block depicted as PROC 910 spans several columns of CLBs and BRAMs.

In one aspect, PROC 910 is implemented as a dedicated circuitry, e.g., as a hard-wired processor, that is fabricated as part of the die that implements the programmable circuitry of the IC. PROC 910 can represent any of a variety of different processor types and/or systems ranging in complexity from an individual processor, e.g., a single core capable of executing program code, to an entire processor system having one or more cores, modules, co-processors, interfaces, or the like.

In another aspect, PROC 910 is omitted from architecture 900 and replaced with one or more of the other varieties of the programmable blocks described. Further, such blocks can be utilized to form a "soft processor" in that the various blocks of programmable circuitry can be used to form a processor that can execute program code as is the case with PROC 910.

The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 9 that are external to PROC 910 such as CLBs 903 and BRAMs 903 can be considered programmable circuitry of the IC.

In general, the functionality and connectivity of programmable circuitry are not established until configuration data is loaded into the IC. A set of configuration bits can be used to program programmable circuitry of an IC such as an FPGA. The configuration bit(s) typically is referred to as a "configuration bitstream." In general, programmable circuitry is not operational or functional without first loading a configuration bitstream into the IC. The configuration bitstream effectively implements or instantiates a particular circuit design within the programmable circuitry. The circuit design specifies, for example, functional aspects of the programmable circuit blocks and physical connectivity among the various programmable circuit blocks.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 910.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable and has a particular function when manufactured as part of the IC.

FIG. 9 is intended to illustrate an exemplary architecture that can be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the top of FIG. 9 are purely exemplary. In an actual IC, for example, more than one adjacent column of CLBs is typically included wherever the CLBs appear, to facilitate the efficient implementation of a user circuit design. The number of adjacent CLB columns, however, can vary with the overall size of the IC. Further, the size and/or positioning of blocks such as PROC 910 within the IC are for purposes of illustration only and are not intended as a limitation.

It should be noted that the IC that may implement/embody the decoder 10 is not limited to the exemplary IC depicted in FIG. 9, and that IC having other configurations, or other types of IC, may also implement/embody the decoder 10.

Although particular embodiments have been shown and described, it will be understood that it is not intended to limit the claimed inventions to the preferred embodiments, and it will be obvious to those skilled in the art that various changes and modifications may be made without department from the spirit and scope of the claimed inventions. The specification and drawings are, accordingly, to be regarded in an illustrative rather than restrictive sense. The claimed inventions are intended to cover alternatives, modifications, and equivalents.

What is claimed is:

1. A method for a low-density parity-check (LDPC) decoder, the method comprising:
    performing, using a processing unit, a forward scan in a first direction of layer L1 of a parity check matrix, wherein the parity check matrix comprises N number of layers and M number of columns;
    performing, using the processing unit, a backwards scan in a second direction of the layer L1 of the parity check matrix, after the forward scan of the layer L1 is completed;
    updating, using the processing unit, layer L2 of the parity check matrix based on a result from the forward scan of layer L1 and a result from the backward scan of layer L1;
    performing, using the processing unit, a forward scan in the second direction of the layer L2 of the parity check matrix, wherein the act of performing the forward scan in the second direction of the layer L2 of the parity check matrix begins (1) after a predetermined time has elapsed since the backwards scan of the layer L1 has begun and (2) before the backwards scan of the layer L1 is completed; and
    performing, using the processing unit, a backwards scan in the first direction of the layer L2 of the parity check matrix, after the forward scan of the layer L2 is completed.

2. The method of claim 1, further comprising updating, using the processing unit, layer L3 of the parity check matrix based on a result of the forward scan of the layer L2 and the backward scan of the layer L2.

3. The method of claim 1, wherein the processing unit comprises a plurality of sub-processing units, and wherein the sub-processing units are used to scan the respective layers of the parity check matrix.

4. The method of claim 1, wherein the first direction and the second direction are in opposite directions.

5. The method of claim 4, wherein the first direction is from left to right across the parity check matrix, and the second direction is from right to left across the parity check matrix, or vice versa.

6. The method of claim 1, wherein the parity check matrix comprises sub-matrices, and wherein at least one of the sub-matrices of the parity check matrix comprises an identity matrix, a cyclically-shifted identity matrix, or an all-zero matrix.

7. The method of claim 1, wherein the predetermined time is based on a computer simulation of the LDPC decoder.

8. The method of claim 1, wherein all of the layers of the parity check matrix are scanned twice for a first iteration.

9. The method of claim 8, wherein all of the layers of the parity check matrix are scanned twice again for one or more additional time(s) until a predetermined number of iterations is achieved.

10. The method of claim 9, wherein the predetermined number of iterations is based on a computer simulation of the LDPC decoder.

11. The method of claim 1, wherein the layer L1 is a first layer in terms of order.

12. A low-density parity-check (LDPC) decoder, the decoder comprising:
    a processing unit configured to:
        perform a forward scan in a first direction of layer L1 of a parity check matrix, wherein the parity check matrix comprises N number of layers and M number of columns;
        perform a backwards scan in a second direction of the layer L1 of the parity check matrix, after the forward scan of the layer L1 is completed;
        update layer L2 of the parity check matrix;
        perform a forward scan in the second direction of the layer L2 of the parity check matrix, wherein the processing unit is configured to begin performing the forward scan in the second direction of the layer L2 of the parity check matrix (1) after a predetermined time has elapsed since the backwards scan of the layer L1 has begun and (2) before the backwards scan of the layer L1 is completed; and perform a backwards scan in the first direction of the layer L2 of the parity check matrix, after the forward scan of the layer L2 is completed.

13. The decoder of claim 12, wherein the processing unit is further configured to update layer L3 of the parity check matrix based on a result of the forward scan of the layer L2 and a result of the backward scan of the layer L2.

14. The decoder of claim 12, wherein the processing unit comprises a plurality of sub-processing units, and wherein the sub-processing units are configured to scan the respective layers of the parity check matrix.

15. The decoder of claim 12, wherein the first direction and the second direction are in opposite directions.

16. The decoder of claim 15, wherein the first direction is from left to right across the parity check matrix, and the second direction is from right to left across the parity check matrix, or vice versa.

17. The decoder of claim 12, wherein the parity check matrix comprises sub-matrices, and wherein at least one of the sub-matrices of the parity check matrix comprises an identity matrix, a cyclically-shifted identity matrix, or an all-zero matrix.

18. The decoder of claim 12, wherein the processing unit is configured to scan all of the layers of the parity check matrix for a first iteration.

19. The decoder of claim 18, wherein the processing unit is configured to scan all of the layers of the parity check matrix twice again for one or more additional time(s) until a predetermined number of iterations is achieved.

20. The decoder of claim 12, wherein the layer L1 is a first layer in terms of order.

\* \* \* \* \*